(12) United States Patent
Duerr et al.

(10) Patent No.: US 8,258,500 B2
(45) Date of Patent: Sep. 4, 2012

(54) PHOTOVOLTAIC DEVICE CONTAINING CARBON NANOTUBES AND AT LEAST ONE ORGANIC HOLE CONDUCTOR

(75) Inventors: Michael Duerr, Esslingen (DE); Gabriele Nelles, Stuttgart (DE); Akio Yasuda, Esslingen (DE)

(73) Assignee: Sony Deutschland GmbH, Cologne (DE)

( * ) Notice: Subject to any disclaimer, the term of this patent is extended or adjusted under 35 U.S.C. 154(b) by 298 days.

(21) Appl. No.: 10/567,929

(22) PCT Filed: Jul. 20, 2004

(86) PCT No.: PCT/EP2004/008105
§ 371 (c)(1),
(2), (4) Date: Nov. 9, 2006

(87) PCT Pub. No.: WO2005/018012
PCT Pub. Date: Feb. 24, 2005

(65) Prior Publication Data
US 2007/0051941 A1 Mar. 8, 2007

(30) Foreign Application Priority Data
Aug. 14, 2003 (EP) .................................. 03018466

(51) Int. Cl.
*H01L 35/24* (2006.01)
(52) U.S. Cl. ........................................................ 257/40
(58) Field of Classification Search ........... 257/40
See application file for complete search history.

(56) References Cited

U.S. PATENT DOCUMENTS

| 6,451,415 | B1 | 9/2002 | Forrest et al. |
| 6,580,027 | B2 * | 6/2003 | Forrest et al. .................. 136/263 |
| 7,329,902 | B2 * | 2/2008 | Vinciguerra et al. ........... 257/87 |
| 2004/0036067 | A1 * | 2/2004 | Andriessen ..................... 257/40 |
| 2004/0168718 | A1 | 9/2004 | Nelles et al. |
| 2004/0214041 | A1 * | 10/2004 | Lu et al. ....................... 428/690 |
| 2004/0226602 | A1 | 11/2004 | Durr et al. |
| 2004/0241900 | A1 * | 12/2004 | Tsukamoto et al. ............ 438/82 |
| 2005/0028862 | A1 | 2/2005 | Miteva et al. |
| 2006/0008580 | A1 | 1/2006 | Nelles et al. |
| 2007/0062576 | A1 | 3/2007 | Duerr et al. |
| 2007/0209696 | A1 | 9/2007 | Duerr et al. |
| 2007/0240761 | A1 | 10/2007 | Miteva et al. |
| 2008/0053525 | A1 | 3/2008 | Nelles et al. |
| 2009/0030102 | A1 | 1/2009 | Nelles et al. |

FOREIGN PATENT DOCUMENTS
JP 2003-096313 4/2003
JP 2003096313 A * 4/2003

OTHER PUBLICATIONS

Machine translation of JP 2003-096313.*
Ago et al, "Electronic interaction between photoexcited poly(p-phenylene vinylene) and carbon nanotubes," Physical Review B, vol. 61, No. 3, Jan. 15, 2000, 2286-2290.*

(Continued)

*Primary Examiner* — Anthony Ho
(74) *Attorney, Agent, or Firm* — Oblon, Spivak, McClelland, Maier & Neustadt, L.L.P.

(57) ABSTRACT

The invention relates to a photovoltaic device, uses of the photovoltaic device, combinations of this photovoltaic device with circuits and to a method of generating electricity from light using this photovoltaic device.

29 Claims, 2 Drawing Sheets

Schematic band diagram and different excitation processes of and in solar cells based on Buckminsterfullerenes.

OTHER PUBLICATIONS

Kymakis E. et al: "Single-wall carbon nanotube/conjugated polymer photovoltaic devices", Applied Physics Letters, vol. 80, No. 1, pp. 112-114, 2002.

Ago Hiroki et al: "Composites of Carbon Nanotubes and Conjugated Polymers for Photovoltaic Devices", Advanced Materials, vol. 11, No. 15, pp. 1281-1285, 1999.

Yoshino Katsumi et al: "Electrical and Optical Properties of Conducting Polymer-Fullerene and Conducting Polymer-Carbon Nanotube Composites", Fullerene Science and Technology, vol. 7, No. 4, pp. 695-711, 1999.

Ganzorig C. et al: Alkali metal acetates as effective electron injection layers for organic electroluminescent devices, Materials Science and Engineering B, vol. 85, No. 2-3, pp. 140-143, 2001.

U.S. Appl. No. 11/578,676, filed Oct. 17, 2006, Duerr, et al.
U.S. Appl. No. 11/578,843, filed Oct. 19, 2006, Duerr, et al.
U.S. Appl. No. 12/518,705, filed Jun. 11, 2009, Duerr, et al.

Gordana Dukovic, et al. "Structural Dependence of Excitonic Optical Transitions and Band-Gap Energies in Carbon Nanotubes" Nano Letters, vol. 5, No. 11(pp. 2314-2318) 2005.

Ray H. Baughman, et la. "Carbon Nanotubes—the Route Toward Applications" Science 297, 787 (2002), www.sciencemag.org.

Kunal Ghosh "Electronic Band Structure of Carbon Nanotubes" Nov. 25, 2005 Stanford University (pp. 1-17).

R.B. Weisman, et al. "Fluorescence Spectroscopy of Single-Walled Carbon Nanotubes in Aqueous Suspension" Applied Physics A, Materials Science & Processing, Appl. Phys. A 78, 1111-1116 (2004).

Office Action issued Feb. 2, 2012, in European Application 03 018 466.7, filed Aug. 14, 2003 (with English-language Translation).

Ph. G. Collins et al., "Nanotubes for Electronics" Scientific America, Inc., vol. 283, No. 6, Dec. 2000, p. 62-69.

L. Cao et al., "Photoconductivity Study of Modified Carbon Nanotube/Oxotitanium Phthalocyanine Composite" J. Phys. Chem. B, vol. 106, No. 35, Sep. 5, 2002, p. 8971-8975.

C. Winder et al., "Towards Increasing the Photon Harvesting in Bulk Heterojunction Polymer Solar Cells" Organic Photovoltaics III, Proceedings of SPIE, vol. 4801, Feb. 26, 2003, p. 22-25.

Y. Wang, "Photoconductivity of Fullerene-doped Polymers" Letters to Nature, vol. 356, No. 6370, Apr. 16, 1992, p. 585-587.

\* cited by examiner

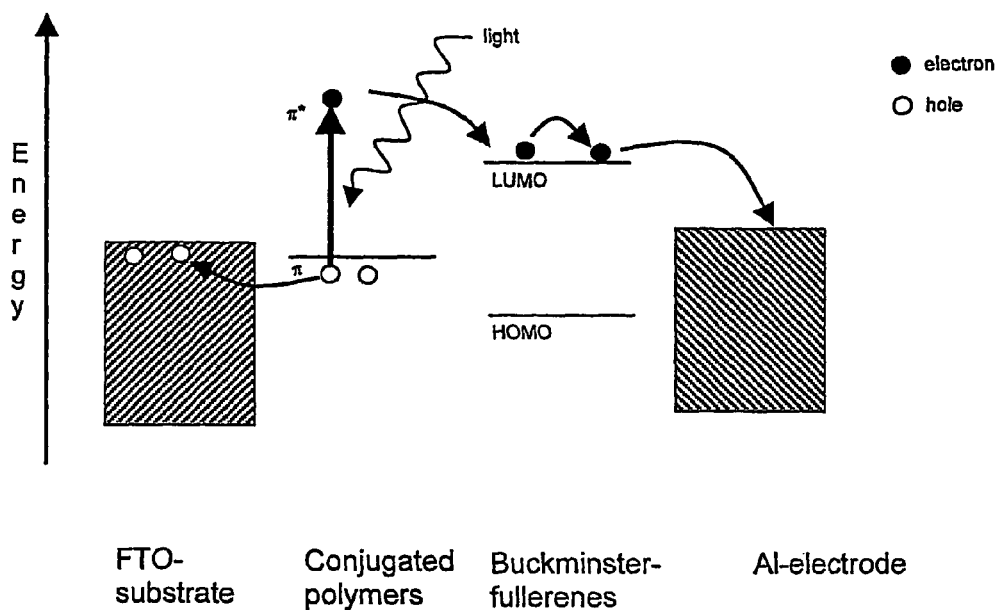
Fig. 1: Schematic band diagram and different excitation processes of and in solar cells based on Buckminsterfullerenes.

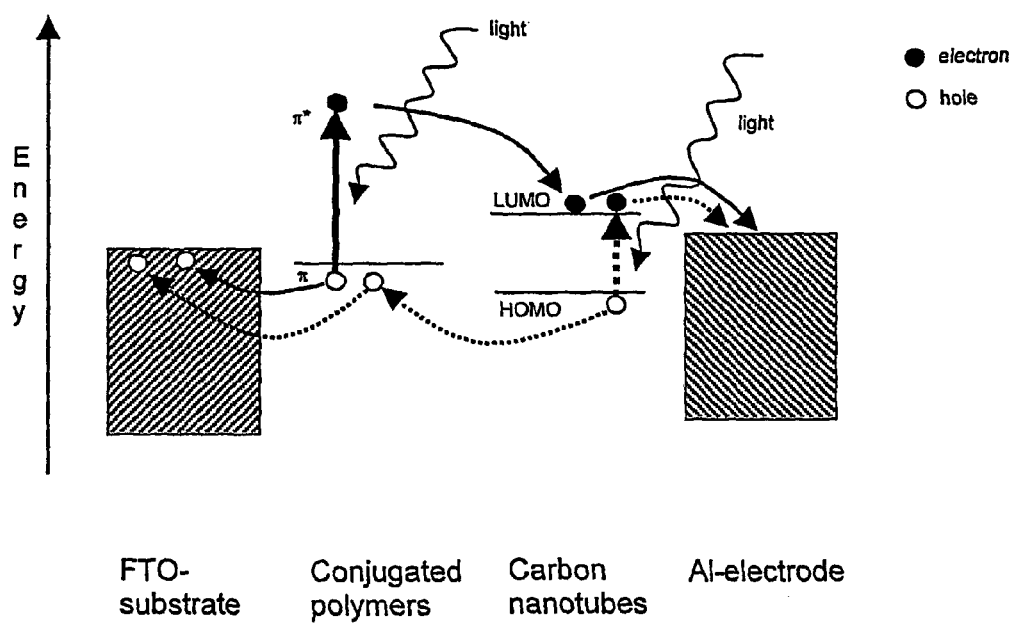
Fig. 2: Schematic band diagram and different excitation processes of and in a carbon nanotube based photovoltaic device according to the present invention.

PHOTOVOLTAIC DEVICE CONTAINING CARBON NANOTUBES AND AT LEAST ONE ORGANIC HOLE CONDUCTOR

The invention relates to a photovoltaic device, uses of the photovoltaic device, combinations of this photovoltaic device with circuits and to a method of generating electricity from light using this photovoltaic device.

Single crystal solar cells show energy conversion efficiencies as high as ~25%. Where the Si-based crystals are no longer single crystals but polycrystalline, the highest efficiencies are in the range of ~18%, and with amorphous Si the efficiencies are ~12%. Solar cells based on Si are, however, rather expensive to manufacture, even in the amorphous Si version. Therefore alternatives have been developed based on organic compounds and/or a mixture of organic and inorganic compounds, the latter type solar cells often being referred to as hybrid solar cells. Organic solar cells are based on organic compounds only, i. e. carbon-containing compounds, and are also sometimes referred to as "plastic-solar cells". Organic and hybrid solar cells are expected to be cheaper to manufacture, but seem to have yet comparably low efficiencies even when compared to amorphous Si cells. Due to their inherent advantages such as lightweight, low-cost fabrication of large areas, earth-friendly materials, or preparation on flexible substrates, efficient organic devices might prove to be technically and commercially useful 'plastic solar cells'. Recent progress in solar cells based on dye-sensitised nanocrystalline titanium dioxide (porous $TiO_2$) semiconductor and a liquid electrolyte, which can be seen as a hybrid between inorganic and organic solar cells, demonstrates the possibility of high energy conversion efficiencies in alternative materials [B. O'Regan and M. Gratzel, Nature 353 (1991) 737].

Fully organic solar cells and their fundamental mechanism are under investigation in an increasing number of laboratories. One main focus of these efforts lies on special types of compound material, e. g., a blend of conjugated polymers and so-called Buckminsterfullerenes, C60, as well as derivatives of those. The main principle is described in Sariciftci et al., Science 258, 1474 (1992); Yu et al., Science 270, 1789 (1995); Brabec et al., Adv. Func. Mat., 11, 15 (2001) and is also shown in FIG. 1. Electrons are excited within the conjugated polymer and injected into the conduction band of the fullerenes. This process ensures an effective charge separation. However, power conversion efficiencies are limited to around 3% mainly do to insufficient charge transport within the blend [Shaheen et al., Appl. Phys. Lett. 78 Carbon nanotubes have been the subject of a huge number of publications within the last decade because of their unique mechanical and electronic properties [Dresselhaus et al., Academic Press, San Diego, ISBN 0-12-221820-5 (1996); Wildöer et al., Nature 391, 59 (1998); Odom et al., Nature 391, 62 (1998)]. Carbon nanotubes can be seen as graphitic sheets with a hexagonal lattice structure wrapped up into seamless cylinders. They display either metallic or semiconducting properties depending on their configuration. In addition, they appear as single-walled or multi-walled tubes and both types can form bundles. They have been successfully used for building, e. g., single tube field effect transistors [Tans et al., Nature 393, 49 (1998); Wind et al., APL 80, 3817 (2002)]. Recently, a method to separate metallic from semiconducting tubes has been proposed [Collins et al., Science 292, 706 (2001); Avouris et al., WO 02/054505; Avouris et al., U.S. Pat. No. 6,423,583 B1; Avouris et al., U.S.-patent application 2002/0173083]. Most recently, it could be shown, that metallic and semiconducting single-wall carbon nanotubes can be separated quantitatively [Cattopadhyay et al., JACS 125, 3370 (2003)]. No fully organic solar cell based on carbon nanotubes has been realised or proposed so far. In Smalley et al., WO 98/39250; Smalley et al., U.S.-patent application 2002/0127162 A1; Smalley et al., U.S.-patent application 2002/0127169 A1; Smalley et al., U.S.-patent application 2002/0159943 A1, a solar cell based on the principle of the Grätzel type hybrid solar cell [O'Regan and Grätzel, Nature 353, 737 (1991)] has been proposed but not realised so far.

Organic solar cells that use polymers which can be processed from solution have been investigated as a low-cost alternative to inorganic solar cells, but the solar power efficiencies have only reached up to 2.5% [Shaheen et al., Appl. Phys. Lett. 78 (2001)]. Nonetheless, conventional inorganic solar cells routinely exhibit solar power conversion efficiencies of 10% and the most advanced, but also the most expensive models, can reach up to 30% efficiency [Green et al., Photovoltaics 9, 287 (2001)].

Accordingly it was an object of the present invention to provide for a photovoltaic device, that is easy and cheap to manufacture and that is furthermore characterized by a high efficiency. Furthermore it has been an object of the present invention to provide for a photovoltaic device the energy conversion efficiency of which is comparable to inorganic photovoltaic devices.

It has furthermore been an object of the present invention to provide for a photovoltaic device which combines the plasticity and flexibility of organic devices with the efficiency of inorganic devices.

All these objects are solved by a photovoltaic device, comprising a composition of carbon nanotubes and of at least one organic compound acting as a hole conductor.

Preferably, the photovoltaic device according to the present invention further comprises
 a first electrode on one side of said composition of carbon nanotubes and of at least one hole conductor, said first electrode having a first work function, and
 a second electrode on another side of said composition of carbon nanotubes and of at least one hole conductor, said second electrode having a higher work function than said first work function.

In one embodiment, said at least one hole conductor is a conjugated polymer or a blend of at least two conjugated polymers.

The term "conjugated polymer", as used herein, is meant to designate a polymer having an extended system of alternating single and double-bonds and/or triple bonds, i. e. an extended π-system.

In one embodiment, said carbon nanotubes are a mixture of metallic and semiconducting carbon nanotubes, preferably only semiconducting carbon nanotubes. In one embodiment said carbon nanotubes are a mixture of multi-walled and single-walled carbon nanotubes, preferably only single-walled carbon nanotubes.

In one embodiment, the carbon nanotubes have a diameter in the range of from 0.5 nm to 2 nm.

In one embodiment, they are arranged in bundles or they are single, or they are a mixture of bundles and singles. Preferably, they are single carbon nanotubes. In one embodiment, the length of the carbon nanotubes varies between 2 nm and 1000 nm, preferably between 50 nm and 1000 nm, most preferably between 100 nm and 500 nm.

Preferably, the band gap of said carbon nanotubes lies in the range of from about 0.5 to about 1 eV.

In one embodiment, the band gap of said at least one hole conductor lies in the range of from about 1 eV to 3 eV, preferably from about 1.5 eV to 2.5 eV, more preferably from about 1.75 eV to 2.25 eV.

In one embodiment, said hole conductor is selected from the group comprising semiconducting organic materials with a band gap above 1 eV and a orbital higher in energy than the highest occupied molecular orbital (HOMO) of said carbon nanotubes.

It is preferred that said composition comprises a mixture of carbon nanotubes and at least one hole conductor.

In one embodiment, said composition is a two-layer-system, wherein said at least one hole conductor is in one layer and said carbon nanotubes are in another layer.

In one embodiment, said composition is a multiple-layer-system, wherein said at least one hole conductor and said carbon nanotubes are in alternating layers.

In one embodiment, said carbon nanotubes have been vertically grown, preferably on one of said electrodes.

Such methods of growth of carbon nanotubes have for example, been described by Li et al., 1996, Science 274, 1701, the disclosure of which is hereby included in its entirety by reference.

In one embodiment, said vertically grown carbon nanotubes are immersed in a hole conductor.

The term "immersed", as used herein, is used synonymously with "surrounded by".

In one embodiment, a hole conductor is directly grown on said carbon nanotubes. Such a method of growth has for example been described by Dai, 2001, Australian Journal of Chemistry, 54, 11.

In one embodiment said carbon nanotubes on which a hole conductor is directly grown ("overgrown nanotubes"), are immersed either in the same hole conductor which has been directly grown on them, or they are immersed in a different hole conductor or a mixture thereof.

In one embodiment, said overgrown nanotubes have been vertically grown, preferably on one of said electrodes.

In one embodiment, said carbon nanotubes have been horizontally aligned, preferably on one of said electrodes.

Such alignment is for example, described in Huag et al., 2001, Science 291, 630, the disclosure of which is hereby included in its entirety by reference.

In one embodiment, said vertically grown carbon nanotubes or said horizontally aligned carbon nanotubes are furthermore combined with a mixture of carbon nanotubes and at least one hole conductor as described above.

The term "combined with", as used in the previous sentence, is meant to signify that the vertically grown or horizontally aligned carbon nanotubes occur together with the mixture of carbon nanotubes and of at least one hole conductor, within the device according to the present invention. Preferably, the device comprises two electrodes wherein a mixture of carbon nanotubes and at least one hole conductor is sandwiched between them. The aforementioned mixture of carbon nanotubes and at least one hole conductor may form a bulk phase between the electrodes. Additionally one or both electrodes may have carbon nanotubes horizontally aligned or vertically grown on them.

In one embodiment, fullerenes are added to the mixture of at least one hole conductor and carbon nanotubes, thereby forming a blend of fullerenes, at least one hole conductor and carbon nanotubes. This blend can be applied either directly between the two electrodes earlier described, or it can be applied in combination with vertically grown or horizontally aligned carbon nanotubes on one of the electrodes, said vertically grown carbon nanotubes and said horizontally aligned carbon nanotubes being preferably vertically grown or horizontally aligned with respect to one of the electrodes.

In one embodiment, fullerenes are added to at least one hole conductor, thereby forming a blend of fullerenes and at least one hole conductor. This blend can be applied in combination with vertically grown or horizontally aligned carbon nanotubes on one of the electrodes, said vertically grown carbon nanotubes and said horizontally aligned carbon nanotubes being preferably vertically grown or horizontally aligned with respect to one of the electrodes.

In one embodiment, said composition of carbon nanotubes and of at least one organic compound acting as a hole conductor comprises a mixture of one carbon nanotube (i.e. one single carbon nanotube), or of an array of single carbon nanotubes, or of one bundle of carbon nanotubes, or of an array of bundles of carbon nanotubes, together with at least one hole conductor.

In this case, i.e. where said composition comprises a mixture of one single carbon nanotube, or of an array of single carbon nanotubes, or of one bundle of carbon nanotubes, or of an array of bundles of carbon nanotubes, together with at least one hole conductor, the resulting photovoltaic device is also referred to as "nano photovoltaic device" or "nano solar cell".

Preferably, said at least one hole conductor or said organic compound acting as a hole conductor (the terms "hole conductor" and "organic compound acting as a hole conductor" are used interchangeably herein and should be understood as synonyms) is selected from the group comprising Polymethacrylates and derivatives, e.g. bis(diarylamino)biphenyl functionalised methacrylates and copolymers thereof, polyaniline and derivatives, polyphenylene and derivatives, polyphenylene vinylene and derivatives, e.g. poly(2-methoxy, 5-(3',7'-dimethyloctyloxy)-1,4-phenylene vinylene (MDMO-PPV), polythiophene and derivatives, copolymers of triphenyl diamine derivatives and trimethoxyvinylsilane, poly(3,4-ethylenedioxythiophene: polystyrene sulfonic acid) (PEDOT:PSS), polyacetylene and derivatives thereof, polyparaphenylene and derivatives thereof, polypyrrole and derivatives thereof, polyparaphenylene sulfide and derivatives thereof, polycarbazole and derivatives thereof, polyisothianaphene and derivatives thereof, poly(1,6-heptadiyne) and derivatives thereof, and polyquinoline and derivatives thereof.

Other examples of preferred compounds acting as hole conductors are disclosed in European patent applications EP 00 111 493.3, filed on May 29, 2000, and EP 01 121 179.4, filed on Sep. 4, 2001, the disclosure of which is hereby included in its entirety by reference.

In one embodiment, the device according to the present invention is an organic solar cell.

Preferably, said first and/or said second electrode is a film or layer of a transparent material.

In one embodiment, said first and/or second electrode is a metallic or metallised electrode.

As used herein, the term "metallised" is used synonymously with "having a sputtered or evaporated metal layer, which is semi-transparent".

In a preferred embodiment, said first or second electrode is a metallic electrode.

In one embodiment, said first and/or said second electrode is coated with an evaporated layer of fluoride or acetate, e.g. LiF, CsF, $CH_3COOLi$, or a combination of fluoride and acetate.

In one embodiment said evaporated layer of fluoride or acetate has a thickness of 0.1 nm to 15 nm, preferably 0.1 nm to 2 nm.

In one embodiment, the device according to the present invention additionally comprises a solid inorganic crystalline or glassy substrate, or a metal foil substrate, preferably stainless steel foil substrate, or a polymer substrate pre-coated with said first or said second electrode.

In one embodiment, the device according to the present invention additionally comprises a flexible polymer substrate pre-coated with said first or said second electrode.

In a preferred embodiment, the photovoltaic device according to the present invention comprises, in that order and preferably adjacent to each other, although intermediate layers may be used as well, the following: a metal electrode having a first work function, an array of carbon nanotubes and hole conductors and a second conductive electrode with a second work function which second work function is higher than the first work function, wherein said second conductive electrode is preferably transparent.

As used herein, the term "array of carbon nanotubes and hole conductors" is meant to designate any arrangement of carbon nanotubes and hole conductors. These may, for example, be simply mixed together and form a bulk phase between the electrodes; or they may be in separate layers, with the carbon nanotubes being in one layer and the hole conductors being in another layer; or they may be in alternating layers, within a multi-layer arrangement. Other arrangements will readily occur to someone skilled in the art. For example in a multi-layer-arrangement, the carbon nanotubes may be present in several layers, but at different concentrations in each layer. The same may apply to the hole conductors.

The objects of the present invention are also solved by a combination of the device according to the present invention with a circuit, wherein the device according to the present invention acts as an internal power supply.

In one embodiment, the internal power supply has dimensions on the nanometer scale, preferably from 10 nm to 10000 nm, more preferably 100 nm to 1000 nm, more preferably 250 nm to 750 nm.

The objects of the present invention are also solved by the use of the device according to the present invention as a solar cell.

The objects of the present invention are furthermore solved by a method of generating electricity from light, characterized in that a device according to the present invention is irradiated by light, whereupon a photo-initiated charge-separation process and subsequently a charge-transport process occurs, and wherein further electricity is recovered from said device.

As used herein, the term "hole conductor" is meant to designate any compound or composition which is capable of accepting holes which holes can thereafter be conducted by and/or within the compound or composition. Such a "hole conductor" is also sometimes referred to as "hole acceptor" or as "hole acceptor/conductor". If it is an "organic hole conductor", this means that the compound or composition is organic in its nature. The term "organic" is used in the generally understood sense, in that it is used to distinguish and to delimit from inorganic materials, i. e. materials which are not based on carbon and carbon containing compounds.

In particular, as used herein, the term "organic" is used in its generally understood meaning, i.e. it refers to compounds which are carbon-containing compounds. As it is used here, it also includes elemental carbon, at least in the form of fullerenes. The term "organic" is further meant to exclude specific carbon-containing compounds such as: hydrogen-free chalko-genides of carbon, e.g. $CO$, $CO_2$, $CS_2$, and derivatives thereof, e.g. $H_2CO_3$, $KSCN$; further excluded are salt-like carbides which are binary compounds of elements with carbon, which decompose to hydrocarbons under the influence of water or dilute acids. Salt-like carbides have the general formula $M^I{}_2C_2$ or $M^{II}C_2$, wherein $M^I$ or $M^{II}$ denotes a metal ion with one or two valences. Salt-like carbide of aluminium ($Al_4C_3$) decomposes to methane. Further excluded carbon-containing compound which do not form part of the term "organic", as used herein, are metallic carbides, which are non-stoichiometric compounds having the character of an alloy. They are resistant to acids and are electrically conducting. Further excluded from the term "organic", as used herein, are metal-carbonyls where carbon monoxide molecules are coordinatively bound to elemental metal atoms, for example iron carbonyl (e.g. $Fe_2(Co)_9$, $Fe_3(Co)_{12}$, chromium carbonyl $Cr(Co)_6$, cobalt carbonyl ($Co_2(CO)_8$, nickel carbonyl $Ni(CO)_4$ etc.).

As used herein, the term "inorganic" is meant to denote compounds which are not "organic" as defined above.

The terms "single carbon nanotubes" and "bundled nanotubes" or simply "singles" and "bundles" are used in their generally understood meanings and refer to carbon nanotubes which are separate entities, appearing as individual tubes ("single"), whereas "bundles" are arrays of nanotubes that are in contact with each other through their sidewalls and have their longitudinal axes aligned in a more or less parallel fashion.

The present invention provides for a network of electron- and hole-acceptors (and therefore also hole- and electron-donors) combining both a good charge carrier transfer from the donors to the acceptors and a good carrier mobility within the constituents of the network.

It furthermore provides for a more effective absorption of light in the visible and near- infra-red region, which distinguishes the devices according to the present invention from the devices of the prior art, e. g. organic solar cells based on fullerenes. The absorption spectra of the latter are centered in the short wavelength region of the visible spectra and therefore, without wanting to be bound by any mechanistic theory, show minor power conversion efficiencies.

The inventors suggest a photovoltaic device which combines the advantages of carbon nanotubes with an organic hole conductor. Such a device is a cheap alternative to existing photovoltaic systems. It overcomes the limitations of fullerene-based organic cells, probably due to a better charge carrier mobility in the carbon nanotubes themselves. Furthermore, by using carbon nanotubes, the spectra of commonly available light sources, including solar irradiation, can be better made use of, because of the absorption properties of carbon nanotubes.

Without wishing to be bound to any particular mechanism of action, the inventors presently believe that the mechanism underlying the invention works as follows: light can excite an electron either in the organic hole acceptor/conductor, which, in many cases is likely to be a conjugated polymer, or it can excite an electron in the carbon nanotubes (see also FIG. 2). In the first case, the photo-excited electron is transferred to the conduction band of the carbon nanotubes, which in this case act as electron acceptors and conductors, while the photo-generated hole stays in the valence band of the organic hole acceptor/conductor. The effectively separated charge-carriers are transported to the electrodes, if present, leading to a photovoltaic activity. If the light excites an electron in the carbon nanotubes, the photo-excited hole is transferred to the organic hole acceptor/conductor with the same result. By adjusting the respective band gaps of the carbon nanotubes, which typically lie in the range of 0.5 to about 1 eV, and of the organic hole acceptor/conductor, e. g. a conjugated polymer, which typically lies around 2 eV, an effective absorption of light, either through the organic hole acceptor/conductor or through the carbon nanotubes, is ensured, independent of the source of irradiation, which may have a solar spectrum or the spectrum of an indoor light source, which is typically shifted to longer wavelengths.

Reference is now made to the figures given as examples, wherein

FIG. 1 shows a schematic band diagram and the different excitation processes of a solar cell based on Buckminsterfullerenes as known from the prior art, and FIG. 2 shows a schematic band diagram and different excitation processes of and in a carbon nanotube-based photovoltaic device according to the present invention.

More specifically, in FIG. 1, light of shorter wavelength leads to an excitation in the polymer (vertical arrow) and subsequent charge separation by electron transfer to the LUMO of the Buckminsterfullerenes. Holes and electrons are collected from the FTO and Al electrode, respectively. The latter ones have to move there by a hopping transport mechanism. Light of longer wavelength is not absorbed.

In FIG. 2, in one embodiment of the device according to the present invention light of short wavelength leads to excitation in the polymer (straight vertical arrow, solid line) and to a subsequent charge separation by electron transfer to the LUMO of the carbon nanotube (curly arrow, solid line). Light of longer wavelength is absorbed within the carbon nanotube (vertical arrow, dotted line) and hole injection to the π-orbital of the polymer leads to efficient charge separation (curly arrow, dotted line). Holes and electrons are collected from the FTO and Al electrode, respectively.

The features of the present invention disclosed in the specification, the claims and/or in the accompanying drawings, may, both separately, and in any combination thereof, be material for realising the invention in various forms thereof.

The invention claimed is:

1. A photovoltaic device, comprising:
   a composition of carbon nanotubes and of at least one organic hole conductor;
   a first electrode on one side of said composition of carbon nanotubes and of at least one organic hole conductor, said first electrode having a first work function, and
   a second electrode on another side of said composition of carbon nanotubes and of at least one organic hole conductor;
   wherein
   said carbon nanotubes are vertical with respect to one of the electrodes,
   the work function of the second electrode is higher than the first work function of the first electrode,
   a band gap of said carbon nanotubes lies in the range of from about 0.5 to about 1 eV, and
   a band gap of the at least one organic hole conductor is in a range of from 1.75 to 2.25 eV.

2. The device according to claim 1, wherein said at least one organic hole conductor is a conjugated polymer or a blend of at least two conjugated polymers.

3. The device according to claim 1, wherein said carbon nanotubes are semiconducting carbon nanotubes.

4. The device according to claim 1, wherein said carbon nanotubes are single-walled carbon nanotubes.

5. The device according to claim 1, wherein the carbon nanotubes have a diameter in the range of from 0.5 nm to 2 nm.

6. The device according to claim 1, wherein said at least one organic hole conductor is selected from the group consisting of semiconducting organic materials with a π-orbital higher in energy than the highest occupied molecular orbital (HOMO) of said carbon nanotubes.

7. The device according to claim 1, wherein said composition of carbon nanotubes and of at least one organic hole conductor comprises a mixture of carbon nanotubes and at least one hole conductor.

8. The device according to claim 1, wherein said composition is a two-layer-system, wherein said at least one organic hole conductor is in one layer and said carbon nanotubes are in another layer.

9. The device according to claim 1, wherein said composition is a multiple-layer-system, wherein said at least one organic hole conductor and said carbon nanotubes are in alternating layers.

10. The device according to claim 1, wherein said at least one organic hole conductor is selected from the group consisting of:
   polymethacrylates and derivatives,
   polyaniline and derivatives,
   polyphenylene and derivatives,
   polyphenylene vinylene and derivatives,
   polythiophene and derivatives,
   copolymers of triphenyl diamine derivatives and trimethoxyvinylsilane,
   poly(3,4-ethylenedioxythiophene: polystyrene sulfonic acid) (PEDOT: PSS),
   polyacetylene and derivatives thereof,
   polyparaphenylene and derivatives thereof,
   polypyrrole and derivatives thereof,
   polyparaphenylene sulfide and derivatives thereof,
   polycarbazole and derivatives thereof,
   polyisothianaphene and derivatives thereof,
   poly(1,6-heptadiyne) and derivatives thereof, and
   polyquinoline and derivatives thereof.

11. An organic solar cell comprising the device according to claim 1.

12. The device according to claim 1, wherein at least one of said first electrode and said second electrode is a film or layer of a transparent material.

13. The device according to claim 12, further comprising a flexible polymer substrate coated with said first or said second electrode.

14. The device according to claim 1, wherein said first or second electrode is a metallic electrode.

15. The device according to claim 1, wherein at least one of said first and said second electrode is coated with a layer of fluoride, a layer of acetate or a layer which is a combination of fluoride and acetate.

16. The device according to claim 15, wherein a thickness of said layer is from 0.1 nm to 2 nm.

17. The device according to claim 1, further comprising a substrate coated with said first or said second electrode, wherein the substrate is one selected from the group consisting of a solid inorganic crystalline substrate, a glassy substrate, a metal foil substrate, a stainless steel foil substrate, and a polymer substrate.

18. A combination of the device according to claim 1 with a circuit, wherein the device acts as an internal power supply.

19. A solar cell comprising the device according to claim 1.

20. The device according to claim 1, wherein said carbon nanotubes are single carbon nanotubes.

21. A method of generating electricity from light, wherein a device according to claim 1 or a combination according to claim 18 is irradiated by light, whereupon a photo-initiated charge-separation process and subsequently a charge-transport process occurs, and wherein electricity is recovered from said device or from said combination.

22. A photovoltaic device, comprising:
a composition of carbon nanotubes and of at least one organic hole conductor;
wherein
said carbon nanotubes have a length of between 100 nm and 500 nm,
a band gap of said carbon nanotubes lies in the range of from about 0.5 to about 1 eV, and
a band gap of the at least one organic hole conductor is in a range of from 1.75 to 2.25 eV.

23. The device according to claim 22, wherein said at least one organic hole conductor is a conjugated polymer or a blend of at least two conjugated polymers.

24. The device according to claim 22, wherein said carbon nanotubes are semiconducting carbon nanotubes.

25. The device according to claim 22, wherein said carbon nanotubes are single-walled carbon nanotubes.

26. The device according to claim 22, wherein the carbon nanotubes have a diameter in the range of from 0.5 nm to 2 nm.

27. The device according to claim 22, wherein said at least one organic hole conductor is selected from the group consisting of semiconducting organic materials with a π-orbital higher in energy than the highest occupied molecular orbital (HOMO) of said carbon nanotubes.

28. An organic solar cell comprising the device according to claim 22.

29. The device according to claim 22, wherein said carbon nanotubes are single carbon nanotubes.

* * * * *